United States Patent [19]

Makino et al.

[11] Patent Number: 4,984,009
[45] Date of Patent: Jan. 8, 1991

[54] IMAGING DEVICE HAVING MEANS TO ACCURATELY SUPERPOSE SHEETS IN THE DEVELOPING PROCESS

[75] Inventors: Kazumasa Makino, Nagoya; Hideo Yoshihara, Kasugai; Michitoshi Akao, Nagoya; Kenji Sakakibara, Ichinomiya; Takeshi Izaki, Nagoya; Tokunori Katoh, Ichinomiya; Hiroshi Morisaki, Nishikasugai; Masanari Kobayashi; Shin Asai, both of Ichinomiya, all of Japan

[73] Assignee: Brother Kogyo Kabushiki Kaisha, Nagoya, Japan

[21] Appl. No.: 424,081

[22] Filed: Oct. 18, 1989

[30] Foreign Application Priority Data

| Oct. 19, 1988 | [JP] | Japan | 63-263315 |
| Oct. 31, 1988 | [JP] | Japan | 63-275701 |
| Jan. 30, 1989 | [JP] | Japan | 1-20507 |
| Jan. 31, 1989 | [JP] | Japan | 1-20508 |
| Jan. 31, 1989 | [JP] | Japan | 1-20509 |
| Jan. 31, 1989 | [JP] | Japan | 1-22926 |

[51] Int. Cl.5 .................................. G03B 27/52
[52] U.S. Cl. .................................. 355/27; 355/100; 355/106
[58] Field of Search ........... 355/27, 107, 317, 100, 355/106

[56] References Cited

U.S. PATENT DOCUMENTS

| 4,745,442 | 5/1988 | Oshikoshi et al. | 355/107 X |
| 4,885,608 | 12/1989 | Okino | 355/317 X |
| 4,901,103 | 2/1990 | Hayakawa et al. | 355/27 |

*Primary Examiner*—L. T. Hix
*Assistant Examiner*—D. Rutledge
*Attorney, Agent, or Firm*—Kane, Dalsimer, Sullivan, Kurucz, Levy, Eisele and Richard

[57] ABSTRACT

An imaging device for forming a visible image by pressurizing and feeding an exposed recording sheet with a developing sheet detects that the recording sheet and the developing sheet are accurately overlapped with each other before the pressurizing operation is begun. The position of the sheets is monitored and the pressurizing rollers are controlled in accordance with the detected positions.

12 Claims, 12 Drawing Sheets

FIG. 7(B)
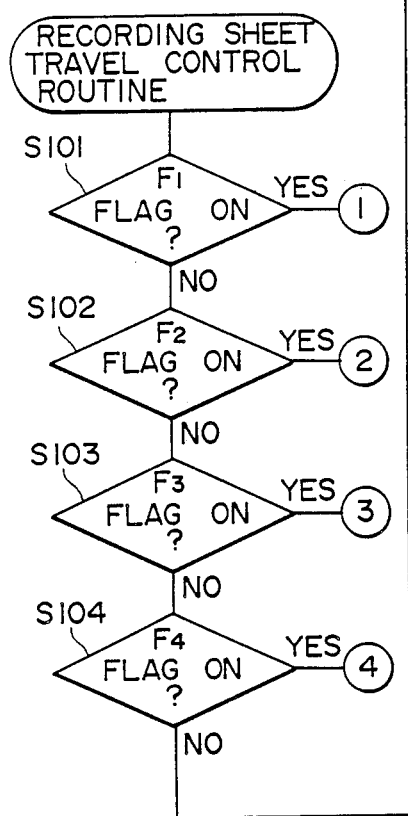
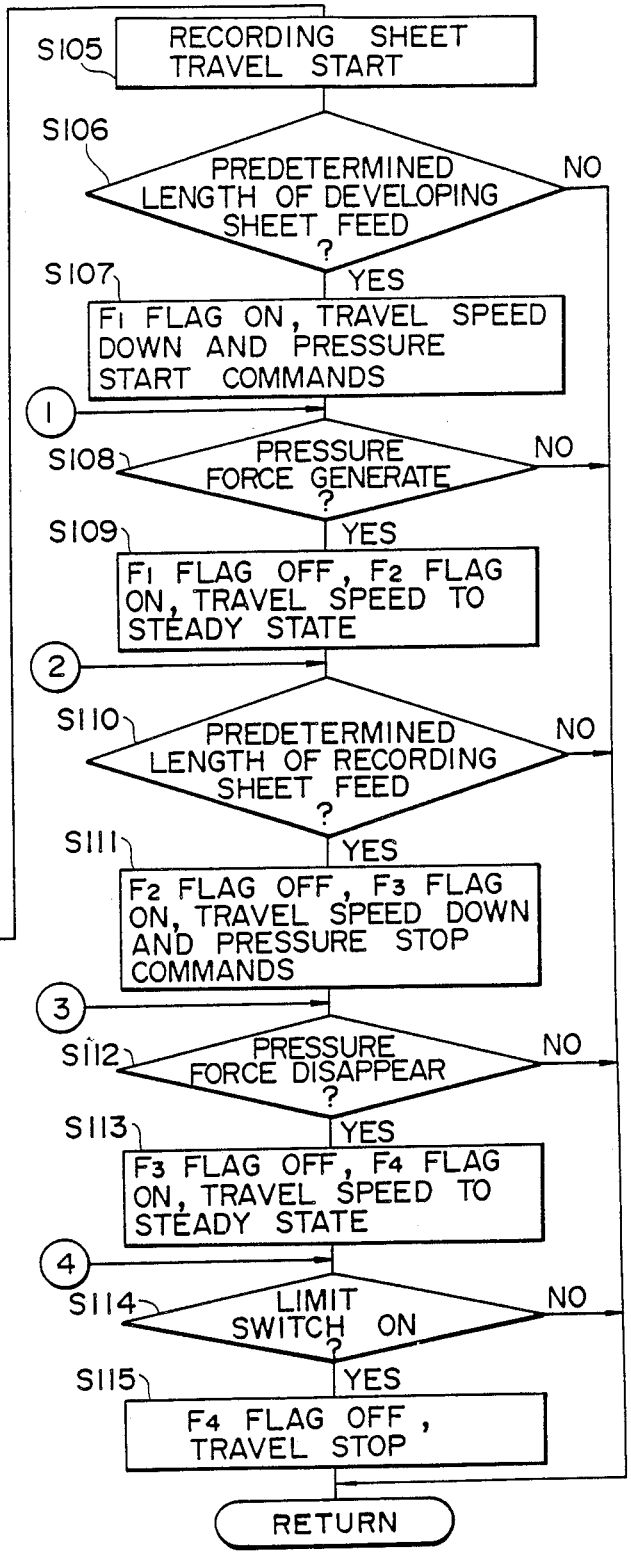

FIG. 7(C)
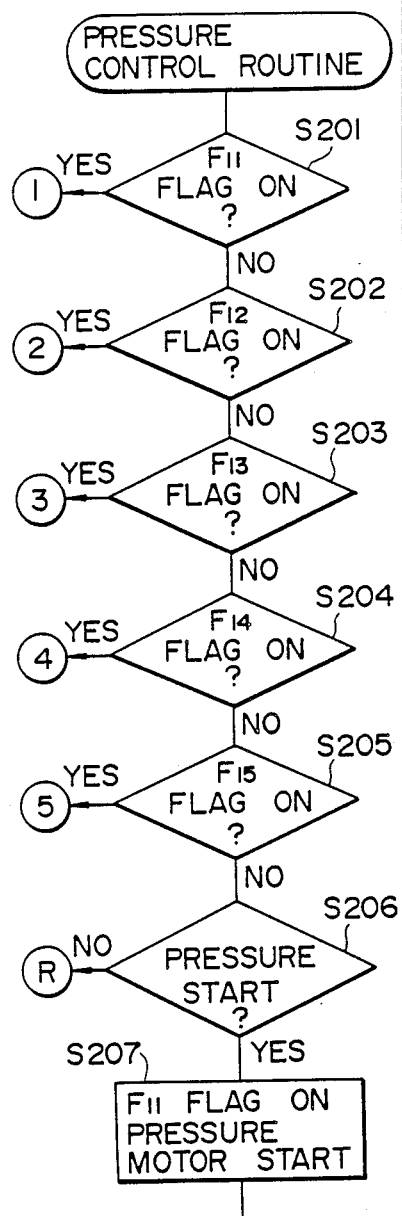
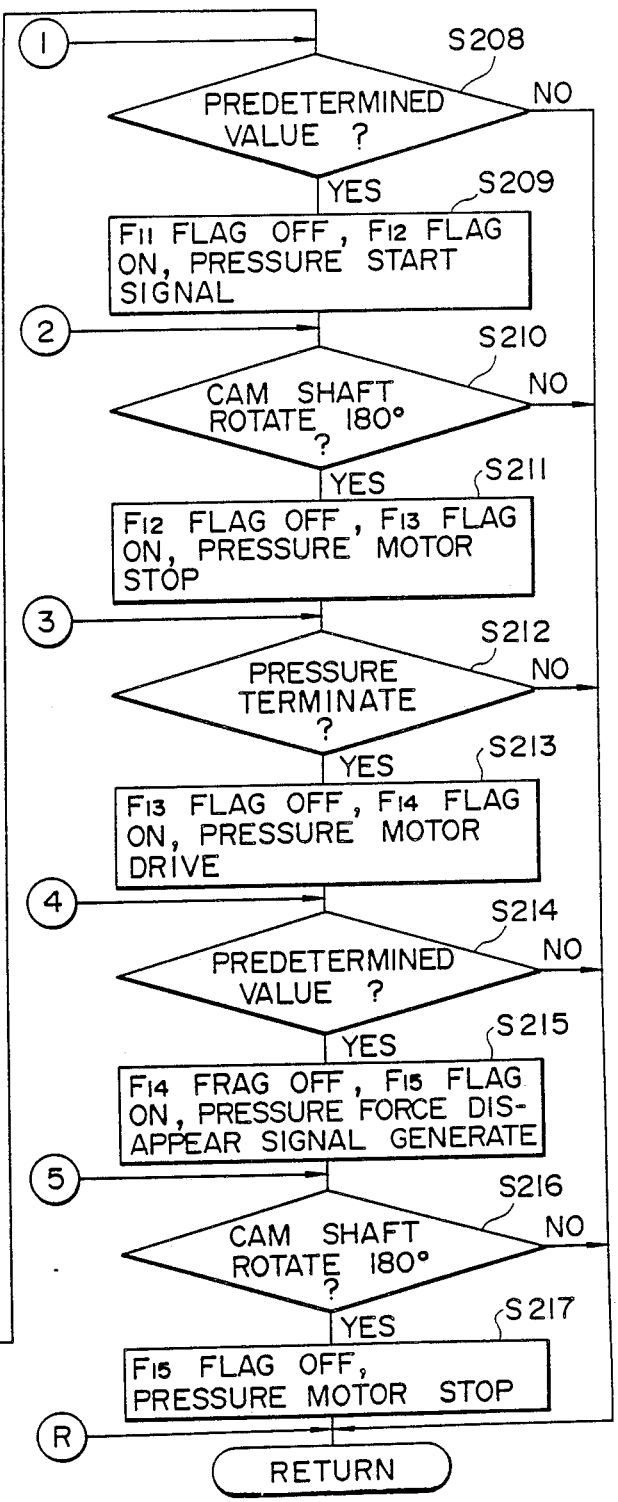

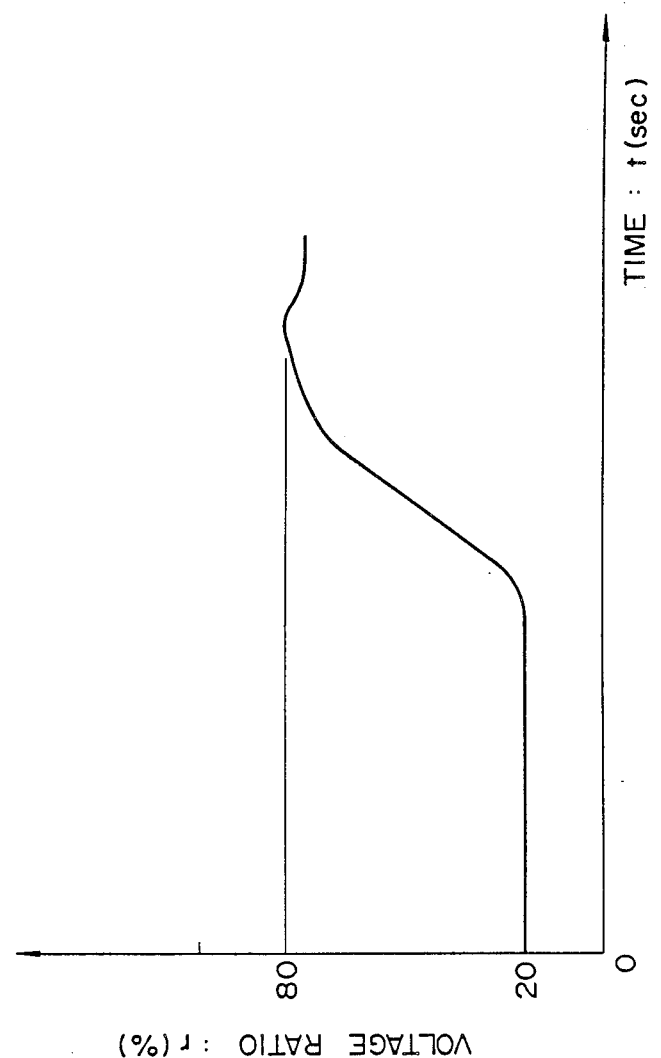

IMAGING DEVICE HAVING MEANS TO ACCURATELY SUPERPOSE SHEETS IN THE DEVELOPING PROCESS

BACKGROUND OF THE INVENTION

This present invention relates to an imaging device such as a copying machine, more particularly to an imaging device, in which a photo and pressure sensitive recording medium (for example, photo and pressure sensitive micro-capsule sheet) on which a latent image has been formed in accordance with a visible image is overlapped with a color development medium (for example, color development sheet), for pressuring them, and forming a visible image on the color development medium side, capable of controlling a timing of pressurizing them in such a manner that these sheets are accurately overlapped.

As a prior art of this type of imaging device, as shown in FIG. 1, the following structure has been well-known. As a wound state photo sensitive micro-capsule sheet 37 is pulled, a latent image corresponding to a visible image of an original document is formed at an exposure stage 19. After that, a cut sheet type color development sheet 38 is contacted with the exposed side of the microcapsule sheet 37 and then they are pressurized and developed by pressure development member, for example, a pair of pressure-developing rollers 21, 31, provided on a pressure development unit 20, thereby forming a visible image on the color development medium.

A plurarity of development sheets 38 are stacked in a casette case 32 and fed out by a semicircular roller 33, and further fed by a feed roller 34 to the pressure development unit 20 through a gate 35 one sheet by one sheet.

In this structure, the pair of rollers 21, 31 are normally open to prevent the roller surfaces from being dirtied by accidental pressuring of the micro-capsule sheet 37. The color development sheet 38 is fed synchronously at the feed speed of the micro-capsule sheet 37 and they are pressurized and developed by the close operation of both of the pair of rollers 21, 31.

In the above device, which further provides a function which increases or decreases the exposure amount on the micro-capsule sheet 37 or a function which enlarges or reduces a visible image by a copy scale factor, a structure where the feed speed of the micro-capsule sheet 37 is varied has been widely used. In this case, the nip timing of the pair of rollers 21, 31 is not changed, whereby a deviation occurs at the start pressure time. Thus, when the pressure operation starts before the color development sheet 38 is sent to the pair of rollers 21, 31, only the micro-capsule sheet 37 is pressurized and the surfaces of the pair of roller 21, 31 are dirtied by a crushing of a plurality of unhardened microcapsules coated on the surface of the micro-capsule sheet 37. On the other hand, when the pressure operation starts in the condition that the color development sheet 38 is excessively fed, the leading end of the color development sheet 38 is not developed.

In the enlargement or reduction state, the exposure start position of the micro-capsule sheet 37 is changed. In this case, the contact position of the exposure side of the micro-capsule sheet 37 and the color development sheet 38 deviates from the correct position.

SUMMARY OF THE INVENTION

It is therefore an object of the present invention to provide an improved imaging device capable of controlling a timing of pressurizing the micro-capsule sheet and the development sheet, for obtaining a beautiful image on the development sheet.

For this purpose, according to this invention, there is provided an imaging device utilizing a continuous-form recording sheet coated with a plularity of photo and pressure sensitive microcapsules each containing dye precursor and a cut-form developing sheet, to be superposed with said recording sheet, coated with a developer material being reactable with the dye precursor, which comprises:

expose means for exposing a latent image corresponding to an image of an original on said recording sheet;

a pair of pressure-developing rollers, adapted to be brought into and out of contact with each other, for pressurizing said recording sheet exposed by said expose means to develop a visible image;

first travel means for causing said recording sheet to travel a at least from said expose means to said pair of pressure-developing rollers;

second travel means for travelling said developing sheet to said pair of pressure developing rollers; and control means for controlling said pressure-developing rollers and said first and second travel means so as to begin to pressurize said recording sheet and said developing sheet when said recording sheet and said developing sheet have travelled to a predetermined positional relationship with said pair of pressure-developing rollers.

DESCRIPTION OF THE ACCOMPANYING DRAWINGS

Figure 4:
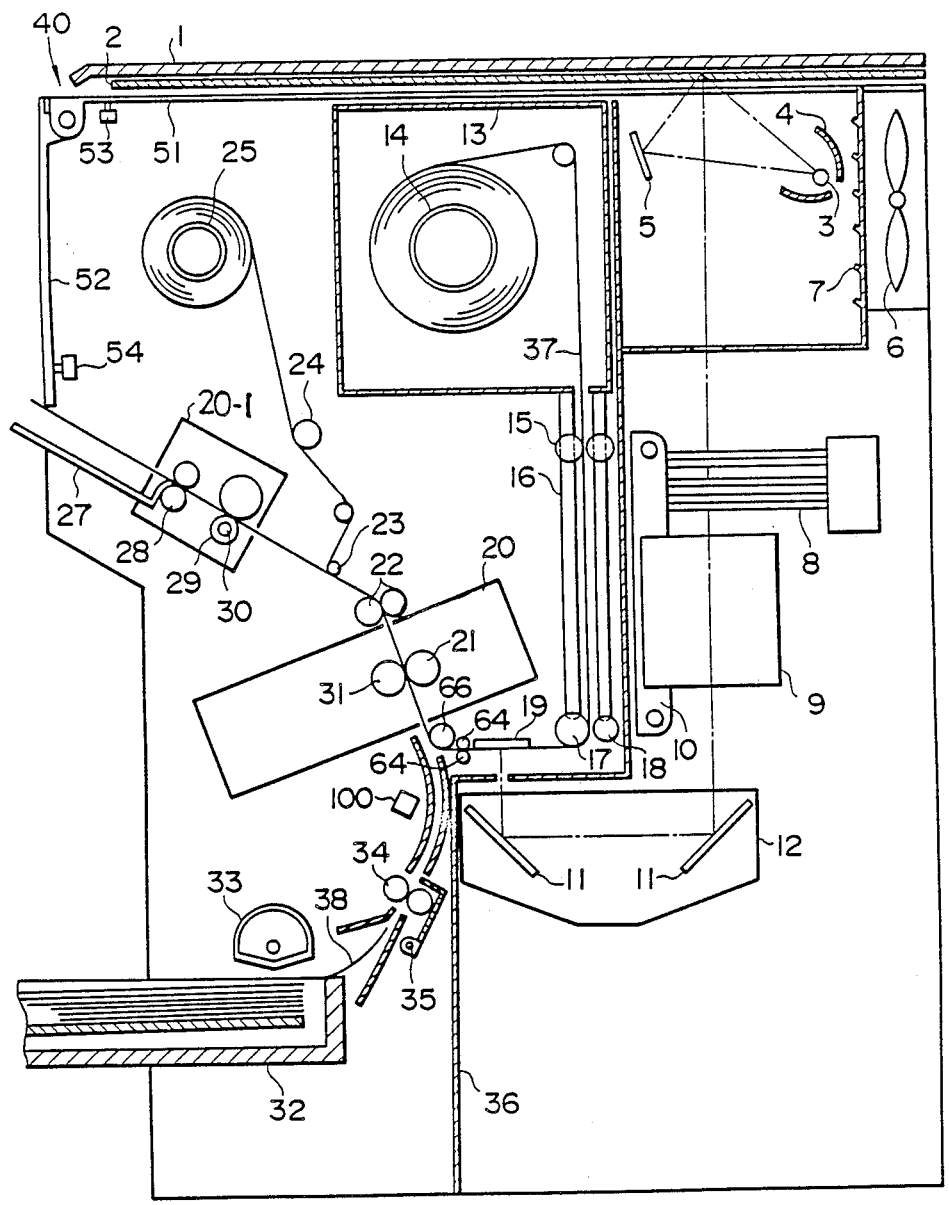
FIG. 4 is a front sectional view of the copying machine embodying the present invention.
Figure 7A:
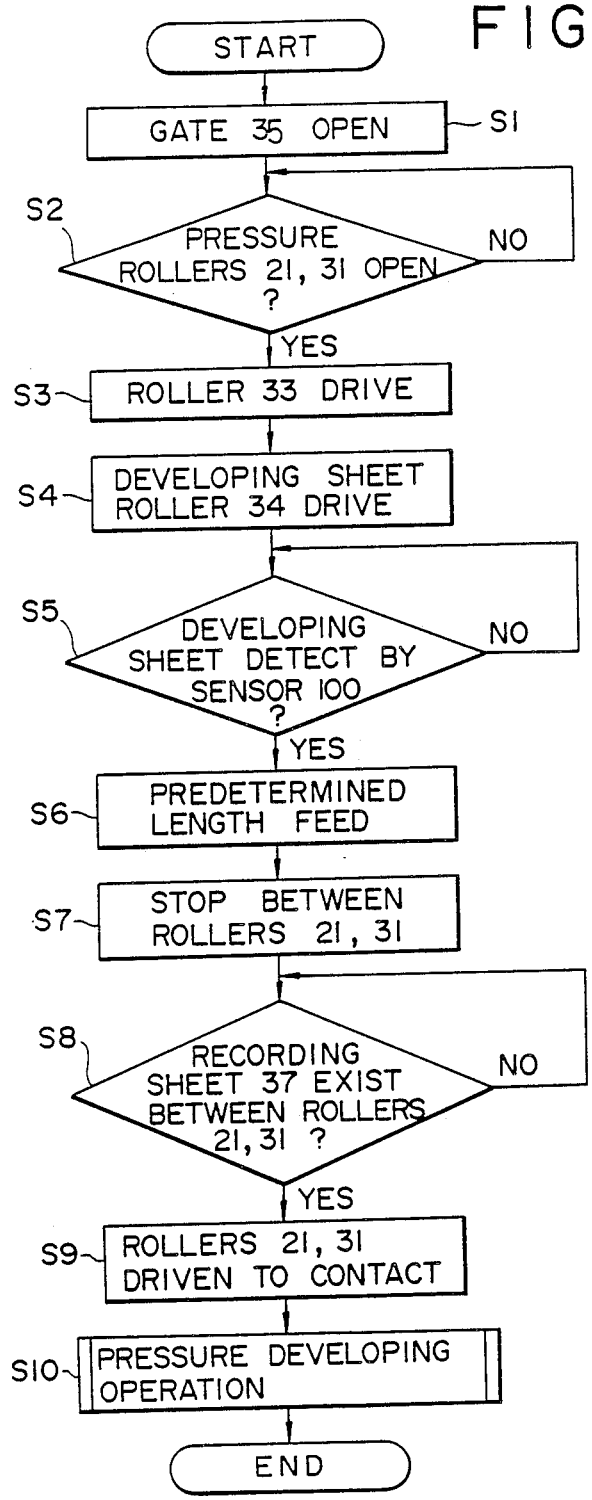
Figure 9:
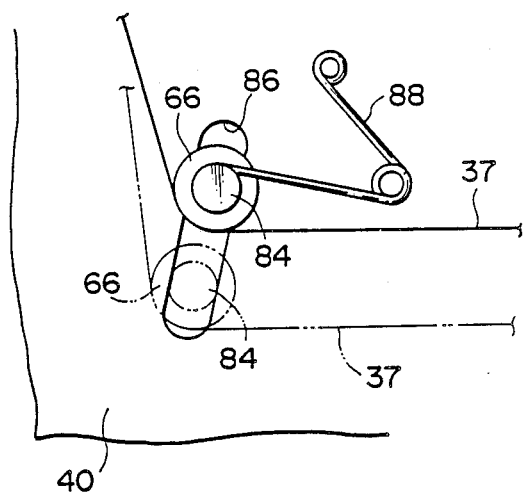
Figure 10:
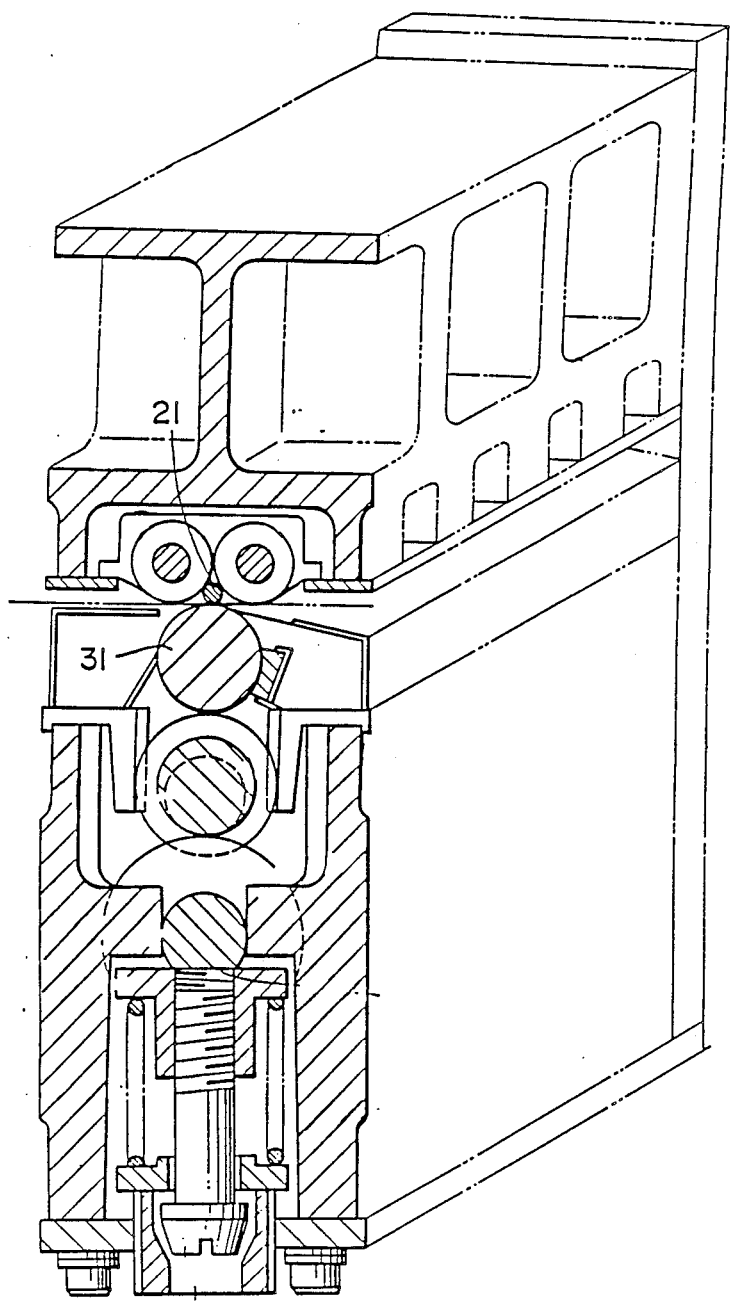

FIG. 7(A) through 7(C) are flow charts showing a process which controls feeding and pressurizing operations of the recording sheet and developing sheet, executed by the copying machine of FIG. 4;

FIG. 8 is a chart showing a relationship between a ratio of supply voltage of a pressure motor and time in pressure start state;

FIG. 9 is a front view showing an operation of a stepped roller provided within the copying machine of FIG. 4; and FIG. 10 is an another illustrative view of an another pressure development unit employed in the copying machine of FIG. 4.

DESCRIPTION OF THE EMBODIMENT

An embodiment according to the present invention is described in the following.

Figure 1:
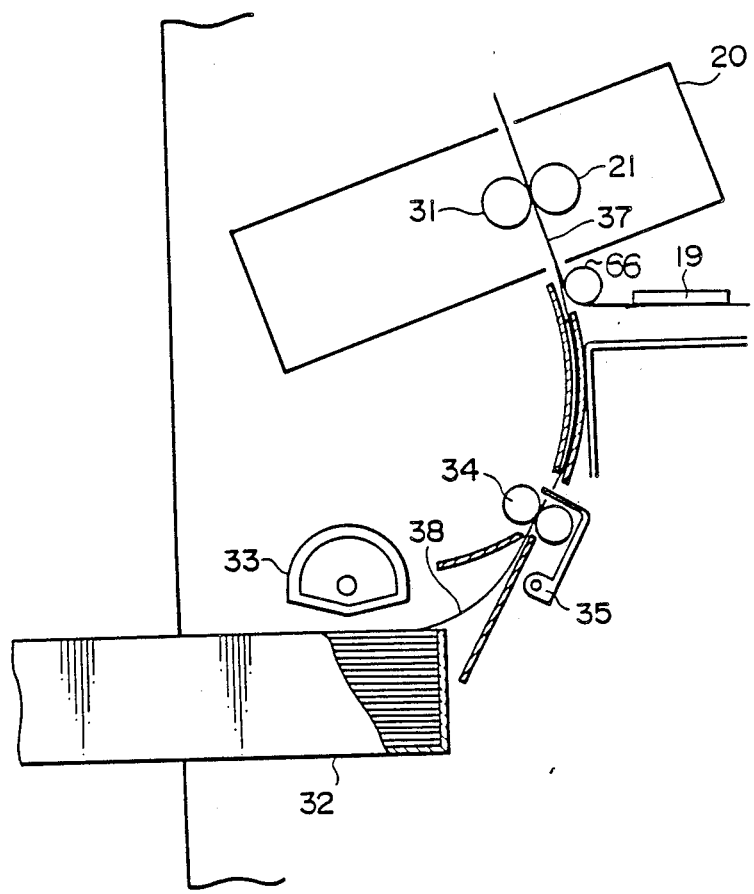
FIG. 1 is an outlined descriptive view showing a conventional sheet feed system for feeding a recording sheet and a developing sheet.
Figure 2:
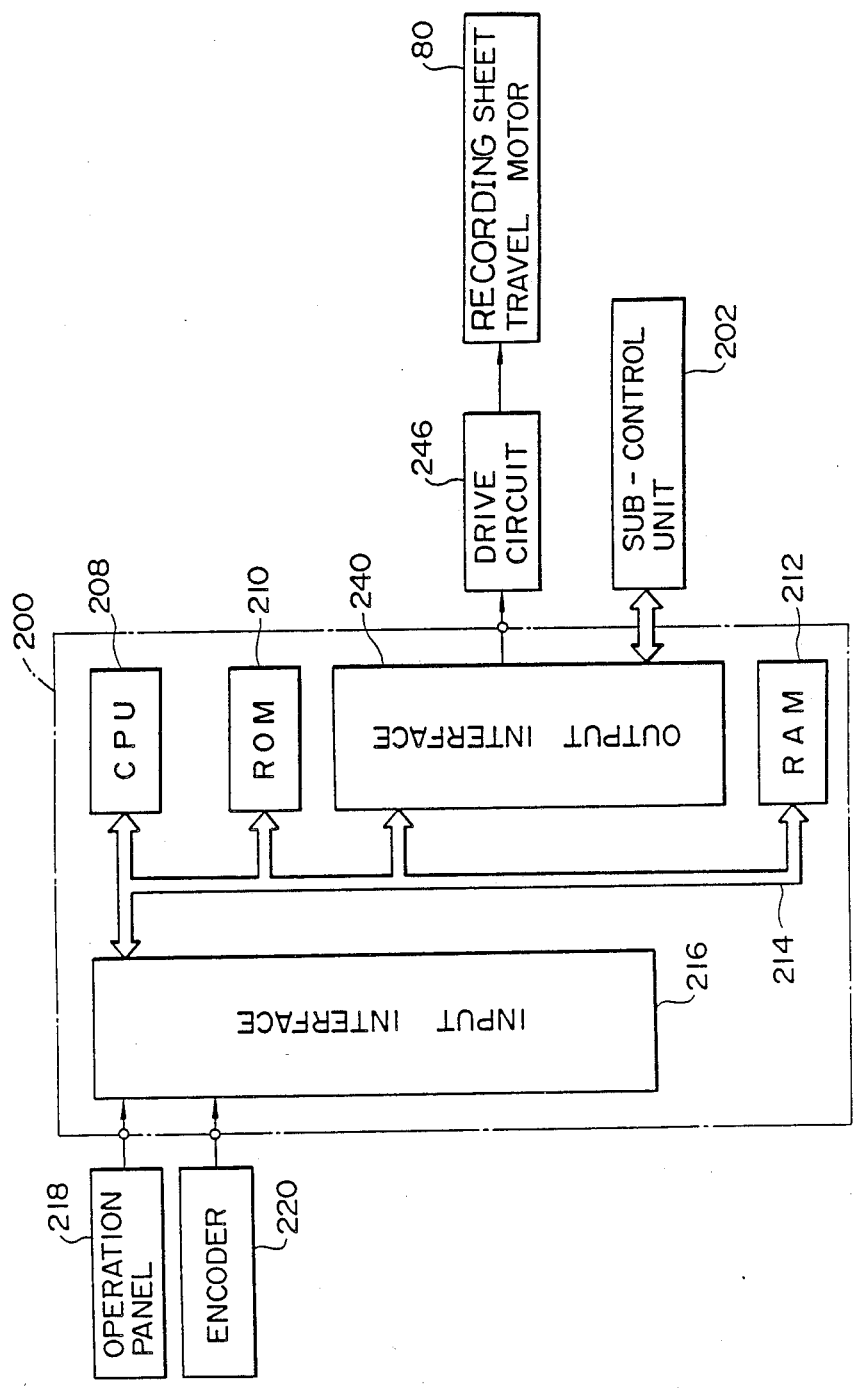
FIG. 2 is a block diagram showing the structure of the main control device which controls the entire copying machine embodying the present invention.
Figure 3:
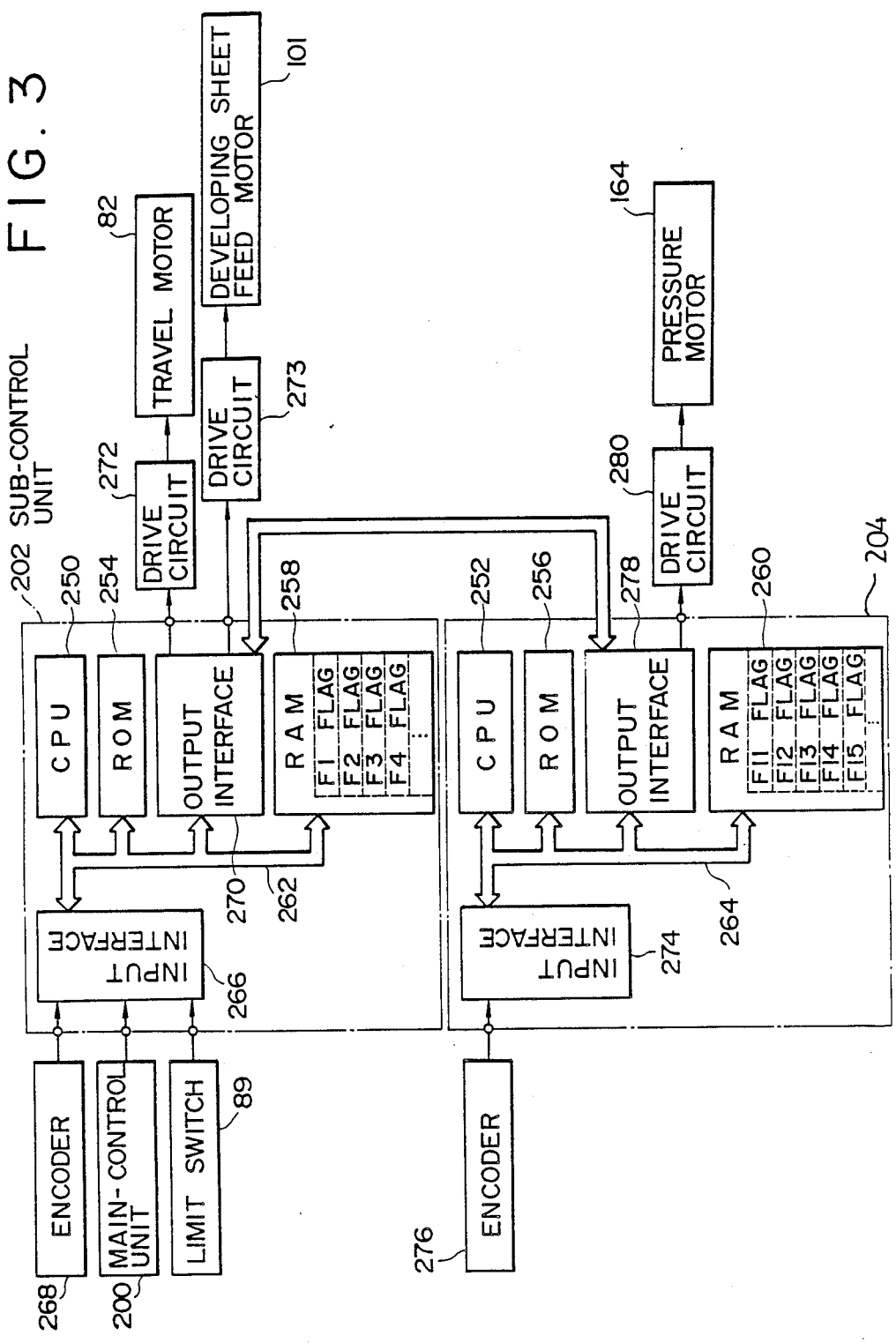
FIG. 3 is a block diagram showing the structures of the above sub feed control device and the pressure development device control device employed in the maincontrol device of FIG. 2.

This copying machine is controlled by a main control device 200 shown in FIG. 2 and a sub feed control device 202 and pressure development device control device 204 shown in FIG. 3. The main control device 200 is structured by a micro-computer equipped with a CPU (Central Processing Unit) 208, a ROM (Read Only Memory) 210, a RAM (Random Access Memory) 212, and a common bus 214 which electrically connects thereto. The bus 214 is connected to an interface 216 which is also connected to an input panel 218 which is equipped with information input keys and copy start switch, an encoder 220 which detects the amount of rotation of the photo and pressure sensitive recording sheet feed motor 80, and so forth.

The bus 214 is also electrically connected to an output interface 240 which is connected to the sub feed control device 202, the photo and pressure sensitive recording sheet feed motor 80, and so forth through a drive circuit 246. The main control device 200 controls the entire operations of the copying machine such as an exposure operation, heating operation and the feeding operation of the photo and pressure sensitive sheet 37 to the pressure development unit 20. A ROM 210 stores various programs necessary to execute the copy operation.

The sub feed control unit 202 controls the feed operation of the color development paper 38 and that of the photo and pressure sensitive sheet 37 from the pressure development unit 20 to the downstream side. The pressure development device control device 204 controls the pressure development unit 20. The control devices 202 and 204 are mainly structured by micro computers containing CPUs 250 and 252, ROMs 254 and 256, RAMs 258 and 260, and buses 262 and 264 which connect thereof. An interface 266 of the sub feed control device 202 is connected to the limit switch 89, an encoder 268 which detects the amount of rotation of the travel motor 82, and the main control device 200. An output interface 270 is connected to the pressure development device control device 204 as well as the travel motor 82, a developing sheet feed motor 101, and so forth through drive circuits 272 and 273. In addition, the RAM 258 has a work area including flags F1, F2, F3, F4, and so forth. The ROM 254 stores a photo and pressure sensitive sheet feed control program as shown in FIG. 7(B), descrived below, a color development sheet feed control program, a synchronous feed control program, and so forth.

An interface connected to the bus 264 of the pressure development device control device 204 is connected to an encoder 276 which detects the amount of rotation of the pressure motor 164. An output interface 278 is connected to the pressure motor 164 through a drive circuit 280. The RAM 260 has a work area including flags F11, F12, F13, F14, and so forth as shown in FIG. 9. The ROM 256 stores a pressure control device unit represented by a flow chart shown in FIG. 7(C), described below, and other programs.

FIG. 4 is an outlined sectional diagram of a photo and pressure sensitive full-color copying machine 40 embodying the present invention. The photo sensitive medium (comprising a micro-capsule sheet 37 and a color development sheet 38) available for such a copying machine has been disclosed in Japanese Provisional Patent Publication No. SHO 58-88739 and so forth.

The top section of a photo and pressure sensitive copying machine 40 is composed of an original document table glass 2 which is movable to the left and right and an original document table cover 1. A desired original document is placed on the original document table glass 2 in a manner that the document side thereof is positioned on the original document table glass 2. Beneath the original document table glass 2, a light source comprising a halogen lamp 3 extending in a direction perpendicular to the moving direction thereof and a semitubular reflecting mirror 4 disposed therearound and a reflector 5 disposed on the left side effectively using the light radiated from the halogen lamp 3 to radiate the original document are provided. On the right side of the halogen lamp 3, a fan 6 and a louver 7 which take in air from the outside are provided. They allow air to be effectively blew to the original document table glass 2. The light which is generated by the halogen lamp 3 and reflected by the original document on the original document table glass 2 penetrates a lens 9 through a filter 8. The filter 8 varies the light penetration characteristic depending on the sensitivity characteristic of a micro-capsule sheet 37 and adjusts the color tone of a copying image. The lens 9 mounted on a lens mounting plate 10 can precisely adjust an angle of optical path. The lens 9 is also movable vertically so as to vary a copy scale factor. The lens 9 is lifted up or down by a lens lifting device, not shown. The light collected by the lens 9 is deflected for 180 degrees by two reflecting mirrors 11 and focused on a micro-capsule sheet 37 in contact with the lower side of an exposure table 19. Both the reflecting mirrors 11, 11 are secured to a mirror mounting plate 12. The optical path and the focal length can be adjusted by precisely adjusting the mirror mounting plate 12.

The roll type micro-capsule sheet 37 is wound on a cartridge shaft 14 which is housed in a cartridge 13 detachably and attachably disposed on the lower side of the original document table glass 2. One end of the micro-capsule sheet 37 is guided by a feed roller 15 and a guide roller 17, passes through the lower side of the exposure table 19, and then supplied to a pressure development unit 20. After that, the end is guided by a separation roller 23 and a skew adjustment roller 24 and then wound to a take-up shaft 25. The micro-capsule sheet 37 which has been fed from a cartridge 13 and not exposed is kept in the non-exposure state by a light insulation cover 16.

The feed speed of the micro-capsule sheet 37 is controlled by a capsule paper feed rollers 22, 22. The feed speed is also varied depending on the moving speed of the original document table glass 2 and the scale factor of a copying image. Latent images of specific lines of the original document are sequentially formed on the micro-capsule sheet 37 when it passes through the exposure table 19.

A control system for feeding the development sheet 38 is described below with referring to FIG. 7(A).

The CPU 250 controls a supply operation of one sheet of the color development sheet 38 from the color development sheet cassette 32. The CPU 250 drives the semicircular roller 33 and frictionally sends the top sheet of the stacked color development sheets 38 housed in the color development sheet cassette 32 (step S1).

In step S2, it is examined whether the pair of pressure rollers 21, 31 are opened.

After that, in the timing at which the top end of the color development sheet 38 being supplied comes to the nip section of the color development paper rollers 34, the CPU 250 drives the color development sheet rollers 34 (step S3, S4). In this embodiment, the feed speed of the color development sheet 38 by the color development sheet rollers 34 is arranged to be fed at a higher speed than that of the micro-capsule sheet 37.

Further, the CPU 250 waits until a sensor 100 disposed at the top end of the color development sheet rollers 34 detects a passing of a leading end of the color development sheet 38 and inputs the acknowledge signal to the CPU 250. When the sensor 100 detects the leading end of the color development sheet 38, if a drive motor for feeding the color development sheet rollers 34 is a step motor, the CPU 250 counts the number of pulses for driving the step motor until it becomes the predetermined number after the sensor 100 detects it (step S5). After the step motor is driven for the predetermined number of pulses, the color development sheet rollers 34 are stopped (step S6, S7). The predetermined number of pulses is set to the number of pulses necessary to feed the color development paper 38 to a position where the leading end of the color development sheet 38 is present between the pair of pressure rollers 21 and 31 after the top end thereof is detected by the sensor 100, namely, a position where the leading end of the color development paper 38 slightly exceeds the contact position of both the rollers 21 and 31. At the time, the pair of pressure rollers 21 and 31 are open.

Further, it is detected that a portion of the micro-capsule sheet 37 coresponding to the leading end of the development sheet 38 reaches the portion between the pair of rollers 21, 31 (step S8).

Thus, the color development sheet 38 is sent to the pressure development device in such a manner that the color development sheet 38 is in contact with the micro-capsule sheet 37 (step S9, S10).

Figure 5:
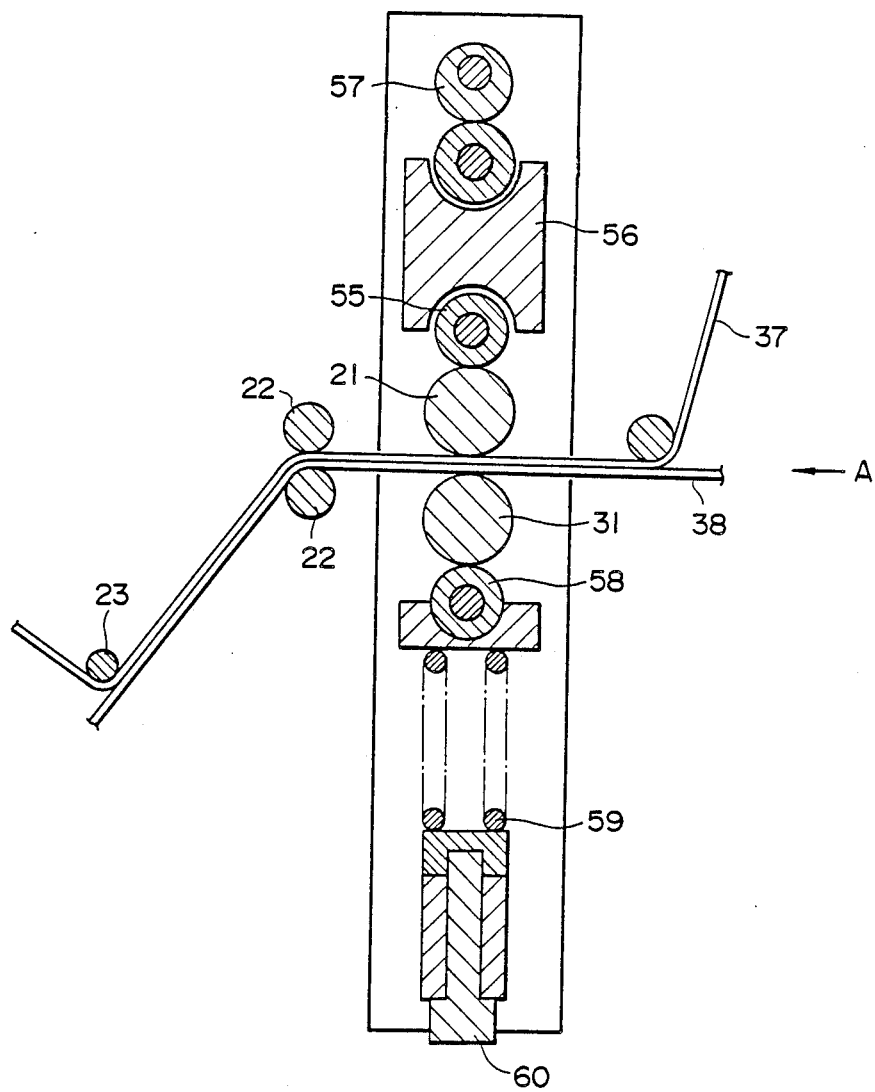
FIGS. 5 and 6 are illustrative views of a pressure development unit employed in the copying machine of FIG. 4.
Figure 6:
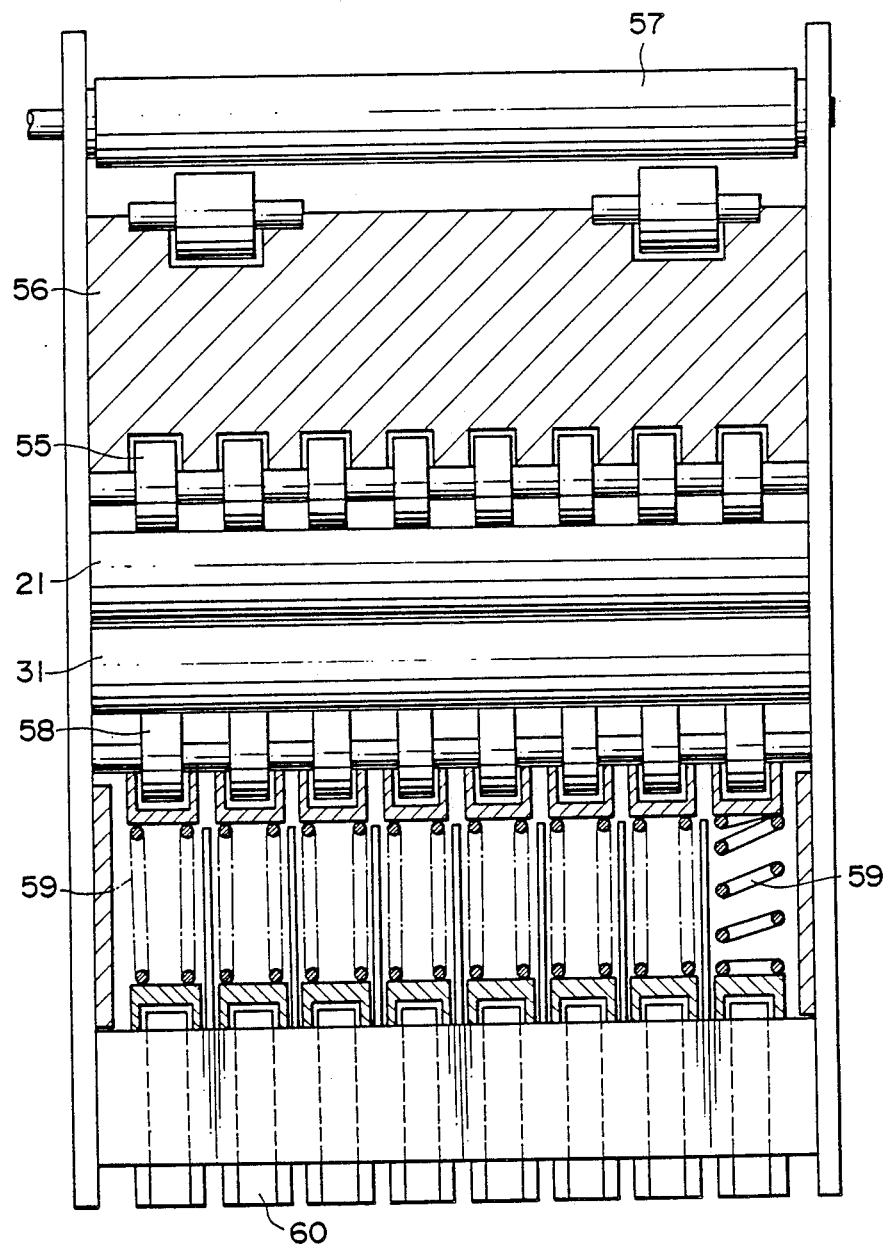

FIG. 5 shows an enlarged view of the pressure development unit 20. The micro-capsule side of the micro-cupsule sheet 37 on which the latent image has been formed is contacted with the color development agent side of the color development sheet 38 and they are niped between the pair of rollers. The roller which is in contact with the micro-capsule sheet 37 and that which is in contact with the color development sheet 38 are named the first roller and the second roller hereinafter, respectively. The first roller 21 is connected to a cam follower 56 through back-up roller 55. The cam follower 56 is in contact with a cam 57. As the cam 57 rotates, both the rollers 21 and 31 are moved in the direction where they are open or closed. In the axial direction of the second roller 31, a large number of back-up rollers 58 are disposed as shown in FIG. 6, a sectional view of the pressure development unit 20 viewed from a direction indicated by an arrow A, each of which is connected to a spring 59. The compression force of the spring 59 is adjusted by a screw 60.

A recording sheet travel control operation and a pressure control operation respecting executed with the control operation of FIG. 7(A) are described with reference to FIG. 7(B) and 7(C). After the main control device 200 outputs the micro-cupsule sheet 37 feed start signal, the micro-cupsule sheet 37 feed control routine shown in FIG. 7(B) is repeatedly executed with an interrupt of a predetermined period. In step S101 (abbreviated S101 hereinafter), the process determines whether the flag F1 has been set or not. The flag F1 has been reset in the initial setting of the main routine (not shown). When S101 is executed first time, the determined condition is NO. In S102, S103, and S104, the process determines whether the flags F2, F3, and F4 have been set or not, respectively. However, the determined condition is NO likewise. In S105, the feeding of the micro-capsule sheet 37 is started. The main control device 200 supplies the cumulative number of pulses of the encoder 220 to the sub feed control device 202 in a predetermined time period. The sub feed control device 202 executes the synchronous feed control routine to control the rotation of the the feed motor 82 so that the cumulative number of pulses supplied from the main control device 200 accords with that of the encoder 268. In non-development state, the pressure rollers 21 and 31 are separated, as described above, whereby they do not perform the feed operation. However, the micro-cupsule sheet 37 is fed and wound to the take-up shaft 14. The rotation speed of the take-up shaft 14 is set so that even if the winding diameter of the micro-cupsule sheet 37 is varied, it is wound without sagging thereof. The excessive amount of winding is absorbed by the slip of the take-up shaft 14.

In S106, the process determines whether the color development sheet 38 has been sent for a predetermined amount or not. The feeding of the color development sheet 38 is controlled under the color development sheet feed program. When the micro-cupsule sheet 37 is sent for the predetermined amount, the color development sheet is fed in accordance with the color development sheet feed start signal which is output from the main control device 200.

If the color development sheet 38 has been sent for the predetermined amount, the determined condition of S106 is YES. In S107, the flag F1 is set and the feed speed down command for the photo and micro-cupsule sheet 37 and the pressure start command are issued, thereby stopping controlling the synchronization of the cumulative number of pulses of the encoder 220 supplied from the main control device and that of the encoder 268. Thus, the rotation speed of the feed motor 82 decreases and the feed amount by the pressure rollers 21, 31 of the micro-cupsule sheet 37 and the take-up amount by the take-up shaft decrease. In S108, the process determines whether a pressure force occurs or not. This determination is conducted in accordance with a pressure force occurrence signal which is outputted in a pressure control routine, described later.

The pressure control routine is executed with a periodical interrupt after a copy start command is inputted. Until the pressure start signal is issued in S107 of the micro-cupsule sheet feed control routine, S201 to S206 are repeatedly executed. When the pressure start command is issued, the determined condition of S206 becomes YES. In S207, the flag F11 is set and a pressure motor, not shown, is started. The rotation speed is controlled by applying a variable pulse width voltage, namely, a pulse voltage where the voltage supply ratio can be varied to the pressure motor. The voltage supply ratio is controlled so that the rotation speed obtained in accordance with the measured result of the encoder 276 becomes constant. However, since the load applied to the compressed coil spring for rotating the one of pressure rollers from the non-pressure position, to keep the rotation speed of the pressure motor constant, it is necessary to increase the voltage supply ratio. As shown in FIG. 9, since the voltage supply ratio is a small constant value until the pressure roller 31 is in contact with the pressure roller 21 because the load applied to a cam shaft for transmitting a rotation power of the pressure motor to the roller 31 is small, after the pressure rollers are in contact with each other, the load increases and the voltage supply ratio also increases, which represents that the pressure force takes place. In the present embodiment, when the voltage supply ratio becomes 80%, the occurence of the pressure force is detected. In S208, the process determines whether the voltage supply ratio becomes 80% or not. The determined condition of S208 is initially NO. By setting the flag F11, S201 and S208 are repeatedly executed as well as S101 and S108. The flag represents that the related operation is being executed when the flag is set and prevents another operation from being executed until the operation being executed is completed.

When the voltage supply ratio becomes 80%, the determined condition of S208 becomes YES. In S209, the flag F11 is reset and flag F12 is set, whereby the pressure force occurrence signal is issued. In this state, the top end of the color development sheet 38 has securely passed through the contact position of the pressure rollers 21 and 31. This operation is assured by using a reference of the position slightly downstream of the contact position of the pressure rollers 21 and 31 rather than the contact position itself.

In S209, the pressure force occurrence signal is issued, whereby the determined condition of S108 in the photo and pressure sensitive paper feed control routine becomes YES. In S109, the flag F1 is reset and the flag F2 is set. Thus, the feed speed restoration command is issued, so that the feed speed of the micro-cupsule sheet 37 increases to the normal speed.

When the voltage supply ratio becomes 80%, since the cam shaft has not come to the pressure position, in S210, the process determines whether the cam shaft 140 has been turned for 180 degrees and moved to the pressure position or not. When the determined condition becomes YES, in S211, the flag F12 is reset and the flag F13 is set. In addition, the pressure motor is stopped and the cam shaft is still placed in the pressure position. Since the cam shaft has not been placed in the pressure position, the feed speed of the micro-cupsule sheet 37 is increased in the state that the predetermined pressure force is not obtained. However, there is a mechanical delay of the operation. Thus, when the feed speed becomes the normal speed, the cam shaft is placed in the pressure position, thereby obtaining the predetermined pressure force.

The micro-cupsule sheet 37 and the color development sheet 38 which are contacted are sent to the pressure rollers 21 and 31 which produce the predetermined pressure force at the restored normal speed and then pressured thereby. The latent image formed on the micro-cupsule sheet 37 is developed on the color development sheet 38. When the pressure rollers 21, 31 are contacted to with each other, the feed speed of the pressure rollers 21 and 31 and the winding amount of the take-up shaft 14 decrease. However, the feed amount of the micro-cupsule sheet 37 by the feed rollers 15 and a stepped roller 64 is not changed. Thus, although the distance between the feed rollers 64 of the micro-cupsule sheet 37 and the pressure rollers 21 and 31 becomes long, the increased length is absorbed by the position change of the stepped roller 64 and the micr-cupsule sheet 37 is tensioned, thereby preventing the micro-cupsule sheet 37 from sagging.

The stepped roller 66 is disposed movably to an inner wall of the case by a shaft 84, as shown in FIG. 8. The shaft 84 is movanly engaged to a slotted hole 86 and tensioned to the micro-cupsule sheet 37 by a spring 88 whereby the stepped roller 66 removeds the sag of the micro-cupsule sheet 37 downstream of the stepped roller 66 is equal to that on the upstream side thereof, the shaft 84 is retreated from the micro-cupsule sheet 37 through the stepped roller 66 as shown in the solid line of the figure and placed in the feed home position determined by the path. If the feed speed on the downstream side becomes slow and the micro-cupsule sheet 37 sags, the stepped roller is advanced as shown in the two dot line to prevent the micro-cupsule sheet 37 from sagging. The home position is detected by a limit switch 89.

While the pressure development operation takes place, in S110 of the micro-capsule sheet feed control routine, the process repeatedly determines whether the micro-capsule sheet 37 has been fed for the predetermined amount or not. In S212 of the pressure control routine, the process repeatedly determines whether the pressure operation has been completed or not. The process returns back to the main routine. When the micro-cupsule sheet 37 is sent for the predetermined amount and the determined condition of S101 becomes YES, in S111, the flag F2 is reset and the flag F3 is set. In addition, the feed speed down command and the pressure end command are issued, whereby the rotation speed of the feed motor 82 decreases and the feed amount by the pressure rollers 21, 31 and the and the winding amount by the take-up shaft 14 decrease. When the pressure end command is received, the determined condition of S212 in the pressure control routine becomes YES, whereby in S213, the flag F13 is reset, the flag F14 is set, and the pressure motor is started. With this operation, although the pressure roller 31 is separated from the pressure roller 21, the load applied to the cam shaft becomes small and the power supply ratio decreases unlike the situation where they approached each other. In the present embodiment, in S214, the process determines whether the pressure force exists or not depending on whether the power supply ratio becomes 40% or not. The determined condition is initially No. S201 to S204 and S214 are repeatedly executed as well as S101 to S103 and S112. When the determined condition of S214 becomes YES, in S215, the flag F14 is reset and the flag F15 is set and the pressure force non-existence signal is issued, whereby the determined condition of S212 becomes YES. Thus, S213 is executed and the feed speed is restored to the normal speed before the pressure force does not exist. When the voltage supply ratio becomes 40%, since the cam shaft has not been placed in the non-pressure position, S216 is executed. When the cam shaft is placed in the non-pressure position, the determined condition of S216 becomes YES. In 117, the rotation of the pressure motor is stopped.

When the voltage supply ratio is 40%, the feed speed is restored. However, because of the mechanical delay, the feed speed is not immediately increased. Thus, the micro-cupsule sheet 37 and the color development sheet 38 are not sent at the high speed in the pressure state. When the pressure roller 21 is separated from the pressure roller 31, the photo and pressure sensitive paper 44 and the color development sheet 38 are sent at the high speed. When the pressure roller 21 is separated from the pressure roller 31, the bottom end of the color development sheet 38 is placed slightly upstream of the contact position of the pressure rollers 21, and 31, thereby preventing only the micro-capsule sheet 37 from being pressurized.

After the micro-cupsule sheet 37 is developed in the above manner, the micro-cupsule sheet 37 is sent and wound by the take-up shaft 14 and the color development sheet 38 is sent to a heating unit 20-1. Although the feed rollers 15 and 64 are stopped when the micro-capsule sheet 37 is developed, the color development sheet 38 can be sent by the heating roller 29 and the nip roller 30-1, so that the take-up shaft 14 winds the excessive portion of the micro-capsule sheet 37 which occurs by decrease of the speed between the feed rollers 64 and the pressure rollers 21 and 31. The micro-capsule sheet 37 is wound until the limit switch 89 detects the shaft 84. When the shaft 84 is returned back to the home position, the determined condition of S114 becomes YES. In S115, the flag F4 is reset, whereby the rotation of the feed motor 82 is stopped and the process returns back to the main routine.

In the copying machine of the present embodiment, when the pressure roller 21 is approached or separated to/from the pressure roller 31, the feed speed of the micro-capsule sheet 37 is lowered, the length of the micro-capsule sheet 37 and the color development sheet 38 to be sent becomes small in the condition that an unsharp image occurs because of insufficient pressure force and the clarity of both ends of the image is improved.

Further, since the feed speed is increased or decreased depending on whether the load caused by the approach or separation of the pressure rollers 21 and 31 is increased or decreased, the time on which the feed speed is decreased can be shortened. Thus, the copy time can be shortened and the moving amount of the stepped roller 66 can be reduced. Consequently, the space where the stepped roller 66 is installed can be reduced and the peripheral materials of the apparatus can be easily designed.

In the above embodiment, the diameters of the pressure rollers 21, 31 are substantially similar, however, it may be considdered that, as shown in FIG. 10, a small diameter roller and a large diameter roller are utilized. In this construction, large power force is easily obtained through a high mechanical strength is needed for the small roller.

In addition, by providing micro-switched 53, 54 for detecting an open state of the cover and arranging the rollers so as to be brought out of contact in accordance with the open state, it becomes easy to maintain and inspect the machine for an operator.

What is claimed is:

1. An imaging device utilizing a continuous-form recording sheet coated with a plurality of photo and pressure sensitive microcapsules each containing dye precursor and a cutform developing sheet, to be superposed with said recording sheet, coated with a developer material being reactable with the dye precursor, which comprises:
    means for exposing a latent image corresponding to an image of an original on said recording sheet;
    a pair of pressure-developing rollers, adapted to be brought into and out of contact with each other, for pressurizing said recording sheet exposed by said exposing means to develop a visible image;
    first travel means for causing said recording sheet to travel at least from said expose means to said pair of pressure-developing rollers;
    second travel means for causing said developing sheet to travel to said pair of pressure developing rollers; and
    control means for controlling said pressure-developing rollers and said first and second travel means so as to begin to pressurize said recording sheet and said developing sheet in case said recording sheet and said developing sheet have traveled to a predetermined positional relationship with said pair of pressure-developing rollers wherein a leading edge of said developing sheet and a predetermined portion of said recording sheet corresponding to said leading edge are overlapped with each other at a predetermined position of a travel path along which said recording sheet has travelled located after the position at which said pair of pressure-developing rollers are brought into contact with each other and said control means controls said second travel means so as not to cause said developing sheet to travel in case that said pair of pressure-developing rollers are brought into contact with each other.

2. The imaging device according to claim 1 wherein said control means includes monitor means for monitoring the travel of said developing sheet, and controls said pair of pressure-developing rollers to be brought into contact with each other based upon the result of the monitoring operation executed by said monitor means.

3. The imaging device according to claim 2, wherein said monitor means comprises a sensor member for detecting a passing of the leading edge of the developing sheet, and controls said second travel means so as to cease said developing sheet at said predetermined position till said predetermined portion of said recording sheet reaches said predetermined position, based upon a result of the detecting operation executed by said sensor member.

4. An imaging device utilizing a continuous-form recording sheet coated with a plurality of photo and pressure sensitive microcapsules each containing dye precursor and a cut-form developing sheet, to be superposed with said recording sheet, coated with a developer material being reactable with the dye precursor, which comprises:
    means for exposing a latent image corresponding to an image of an original on said recording sheet;
    a pair of pressure-developing rollers, adapted to be brought into and out of contact with each other, for pressurizing said recording sheet exposed by said exposing means to develop a visible image;
    first travel means for causing said recording sheet to travel at least from said expose means to said pair of pressure-developing rollers;
    second travel means for causing said developing sheet to travel to said pair of pressure developing rollers; and
    control means for controlling said pressure-developing rollers and said first and second travel means so as to begin to pressurize said recording sheet and said developing sheet in case said recording sheet and said developing sheet have traveled to a predetermined positional relationship with said pair of pressure-developing rollers wherein a leading edge of said developing sheet and a predetermined portion of said recording sheet corresponding to said leading edge are overlapped with each other at a predetermined position of a travel path along which said recording sheet has travelled located after the position at which said pair of pressure-developing rollers are brought into contact with each other wherein said control means further controls said first travel means so as to vary said recording sheet speed in accordance with a state of said pressure-developing rollers.

5. The imaging device according to claim 4 wherein said control means includes examining means for examining whether a pressure force value between said pressure-developing rollers is less than a first predetermined value and larger than a second predetermined value, and controls said first travel means so as to cause said recording sheet to travel at a predetermined speed in case that it is determined by said examining means that the pressure force value is not a value between said first predetermined value and said second predetermined value, while controlling said first travel means so as to cause said recording sheet to travel at a speed less than said predetermined speed in case the examined pressure force value is between said first predetermined value and said second predetermined value.

6. The imaging device according to claim 5 which further comprises another control means for controlling a tension force value of said recording sheet between said expose means and said pair of pressure-developing rollers so as to be a constant value.

7. The imaging device according to claim 6 wherein said another control means comprises a feed roller member for feeding said recording sheet, provided between said expose means and said pair of pressure-developing rollers and arranged to be movable in accordance with a variation in the speed of said recording sheet.

8. An imaging device utilizing a photo and pressure sensitive recording medium and including at least one cover member provided on a case member of said imaging device and arranged to be displaceable between an open state and a closed state, said device comprising:
  means for exposing an optical image corresponding to an image of an original on said recording medium;
  a pair of pressure-developing rollers, adapted to be brought into and out of contact with each other, for pressurizing said recording medium exposed by said exposing means to develop a visible image;
  travel means for causing said recording medium to travel to said pair of pressure-developing rollers;
  first control means for controlling said pressure-developing rollers and said travel means so as to begin to pressurize said recording medium in case that said recording medium has travelled to a predetermined positional relationship with said pair of pressure-developing rollers; and,
  second control means for controlling said pressure-developing rollers so as to be brought out of contact in case that said cover is opened.

9. The imaging device according to claim 8, wherein said recording medium comprises a continuous-form recording sheet coated with a plurality of photo and pressure sensitive microcapsules each containing dye precursor and a cut-form developing sheet to be superposed with said recording sheet coated with a developer material being reactable with the dye precursor, and wherein said predetermined positional relationship is that a leading edge of said developing sheet and a predetermined portion of said recording sheet corresponding to said leading edge are overlapped with each other at a predetermined position of the travel path along which the recording sheet is fed, located after the position at which said pair of pressure-developing rollers are brought into contact with each other.

10. The imaging device according to claim 8 wherein said second control means includes a micro-switch member for detecting the open state of said cover member.

11. An imaging device utilizing a continuous-form recording sheet coated with a plurality of photo and pressure sensitive microcapsules each containing dye precursor and a cut-form developing sheet, to be superposed with said recording sheet, coated with a developer material being reactable with the dye precursor, which comprises:
  means for exposing a latent image corresponding to an image of an original on said recording sheet;
  a pair of pressure-developing rollers, adapted to be brought into and out of contact with each other, for pressurizing said recording sheet exposed by said exposing means to develop a visible image;
  first travel means for causing said recording sheet to travel at least from said expose means to said pair of pressure-developing rollers;
  second travel means for causing said developing sheet to travel to said pair of pressure developing rollers; and
  control means for controlling said pressure-developing rollers and said first and second travel means so as to begin to pressurize said recording sheet and said developing sheet in case said recording sheet and said developing sheet have traveled to a predetermined positional relationship with said pair of pressure-developing rollers wherein a leading edge of said developing sheet and a predetermined portion of said recording sheet corresponding to said leading edge are overlapped with each other at a predetermined position of a travel path along which said recording sheet has travelled located after the position at which said pair of pressure-developing rollers are brought into contact with each other;
  said control means further including monitor means for monitoring the travel of said developing sheet, and said control means controls said pair of pressure-developing rollers so as to be brought into contact with each other based upon the result of the monitoring operation executed by said monitor means.

12. The imaging device according to claim 11, wherein said monitor means comprises a sensor member for detecting a passing of the leading edge of the developing sheet and said control means controls said second travel means so as to stop said developing sheet at said predetermined position until said predetermined portion of said recording sheet reaches said predetermined position, based upon a result of the detecting operation executed by said sensor member.

* * * * *